(12) United States Patent
Apelsmeier et al.

(10) Patent No.: US 11,183,489 B2
(45) Date of Patent: Nov. 23, 2021

(54) POWER ELECTRONICS MODULE

(71) Applicant: AUDI AG, Ingolstadt (DE)

(72) Inventors: Andreas Apelsmeier, Pollenfeld (DE); Johann Asam, Adelzhausen (DE)

(73) Assignee: AUDI AG, Ingolstadt (DE)

( * ) Notice: Subject to any disclaimer, the term of this patent is extended or adjusted under 35 U.S.C. 154(b) by 304 days.

(21) Appl. No.: 16/603,667

(22) PCT Filed: Apr. 11, 2018

(86) PCT No.: PCT/EP2018/059347
§ 371 (c)(1),
(2) Date: Oct. 8, 2019

(87) PCT Pub. No.: WO2018/189276
PCT Pub. Date: Oct. 18, 2018

(65) Prior Publication Data
US 2021/0091054 A1 Mar. 25, 2021

(30) Foreign Application Priority Data
Apr. 11, 2017 (EP) .................................. 17166088

(51) Int. Cl.
H01L 25/11 (2006.01)
H01L 23/492 (2006.01)
H01L 23/498 (2006.01)
H01L 23/00 (2006.01)

(52) U.S. Cl.
CPC .......... *H01L 25/112* (2013.01); *H01L 23/492* (2013.01); *H01L 23/49822* (2013.01); *H01L 23/49833* (2013.01); *H01L 24/29* (2013.01); *H01L 24/48* (2013.01); *H01L 2224/2612* (2013.01); *H01L 2224/29582* (2013.01);
(Continued)

(58) Field of Classification Search
CPC ..... H01L 23/492–4928; H01L 2224/72; H01L 2224/90; H01L 2224/48153–48195; H01L 2224/2612–26175
See application file for complete search history.

(56) References Cited

U.S. PATENT DOCUMENTS

| 2002/0043708 A1 | 4/2002 | Muto et al. |
| 2006/0055011 A1 | 3/2006 | Carney et al. |
| 2012/0181996 A1 | 7/2012 | Gehrke |

(Continued)

FOREIGN PATENT DOCUMENTS

| DE | 19612838 A1 | 5/1997 |
| DE | 102005039478 A1 | 2/2007 |

(Continued)

OTHER PUBLICATIONS

Extended European Search Report dated Jan. 26, 2018 in corresponding European Application No. 17166088.9; 12 pages.

(Continued)

Primary Examiner — Amar Movva
(74) Attorney, Agent, or Firm — Maier & Maier, PLLC

(57) ABSTRACT

A power electronics module includes a substrate with a substrate metallization layer, which is separated into conducting areas for providing conducting paths for the power electronics module; a semiconductor switch chip bonded with a first power electrode to a first conducting area of the substrate metallization layer; a conductor plate bonded to a second power electrode of the semiconductor switch chip opposite to the first power electrode.

17 Claims, 4 Drawing Sheets

(52) U.S. Cl.
   CPC ............... *H01L 2224/4824* (2013.01); *H01L 2224/4826* (2013.01); *H01L 2224/48155* (2013.01)

(56) References Cited

U.S. PATENT DOCUMENTS

2013/0113114 A1   5/2013   Hosseini et al.
2013/0307156 A1   11/2013  Reinhold et al.

FOREIGN PATENT DOCUMENTS

| DE | 102012204159 A1 | 3/2013 |
| DE | 102013106932 A1 | 1/2014 |
| EP | 0152818 A2 | 8/1985 |
| EP | 0513410 A1 | 11/1992 |
| EP | 1255299 A2 | 11/2002 |
| EP | 2498289 A2 | 9/2012 |
| EP | 2782124 A1 | 9/2014 |
| EP | 2790215 A1 | 10/2014 |
| EP | 2889902 A1 | 7/2015 |
| JP | 3216305 B2 | 10/2001 |
| JP | 2004-311685 A | 11/2004 |
| WO | 2002/058151 A1 | 7/2002 |

OTHER PUBLICATIONS

International Search Report and Written Opinion dated Sep. 27, 2018 in corresponding International Application No. PCT/EP2018/059347; 26 pages.

POWER ELECTRONICS MODULE

FIELD

The invention relates to a power electronics module.

BACKGROUND

Power electronics modules containing solid-state switching devices, such as IGBTs or Power-MOSFETs, are used in various power electronics applications to switch or rectify electric currents. An important and fast growing application is converter systems for electric or hybrid electric vehicles. A typical six-pack module for such applications may have a voltage rating of up to 1200 V and a current rating of several 100 A. Since the installation space in electric vehicles is usually very limited and geometrically constrained, it is of high advantage if power electronics modules and converters of the electrical drivetrain are as compact as possible to allow for flexible installation.

One approach to increase the power density of a power electronics module is die stacking, i.e., leaving the traditional two-dimensional circuit layout of side-by-side arrangement of semiconductor chips and heading for an arrangement in the third dimension. For example, a semiconductor switch together with its free-wheeling diode may be stacked into a die stack.

Although the footprint of the semiconductor chips may be reduced by die stacking, other on-board components and electrical conductors are still arranged beside the die stack and may result in further considerable footprint and respective stray inductances that may lead to considerable electromagnetic coupling.

Furthermore, die stacking may result in a complex manufacturing sequence involving a plurality of individual bond layer interfaces and materials.

JP 2004 311 685 A, US 2012 181 996 A1 and US 2013 113 114 A1 show electronics modules with stacked semiconductor chips.

SUMMARY

It is an objective of the invention to provide a power electronics module with enhanced power density having a low stray inductance generated by the electrical interconnections of the semiconductor chips provided by the power electronics module. It is a further objective of the invention to simplify the manufacturing of a power electronics module.

These objectives are achieved by the subject-matter of the independent claim. Further exemplary embodiments are evident from the dependent claims and the following description.

The invention relates to a power electronics module. A power electronics module may be any assembly mechanically and electrically supporting one or more semiconductor chips. It has to be noted that the term power may be related to modules and/or semiconductor chips, which are adapted for processing a voltage of more than 100 V and/or than 10 A.

According to an embodiment of the invention, the power electronics module comprises: a substrate with a substrate metallization layer, which is separated into conducting areas for providing conducting paths for the power electronics module; at least one semiconductor switch chip bonded with a first power electrode to a first conducting area of the substrate metallization layer; a conductor plate bonded to a second power electrode of the semiconductor switch chip opposite to the first power electrode; and a gate conductor bonded to a gate electrode of the semiconductor chip besides the second power electrode.

The substrate may be a ceramics substrate that on at least one side is provided with the metallization layer, which may be a copper layer. The semiconductor switch chip may comprise a transistor or thyristor. For example, the semiconductor switch chip may be an IGBT or MOSFET. The semiconductor switch chip may be based on a wide bandgap material, such as SiC.

As will be described below in more detail, the power electronics module also may comprise a semiconductor chip with a diode, which may be connected anti-parallel to the switch of the semiconductor switch chip. Also the semiconductor chip with a diode may be based on a wide bandgap material, such as SiC. Wide bandgap semiconductor chips may result in reduced losses and/or may have the capability to operate at high junction temperatures, for example higher than 200° C.

The semiconductor switch chip and also the further semiconductor chip with the diode may be vertical devices with two planar sides on which two power electrodes are provided. A power electrode may be a metallization layer on the respective chip, which is adapted for conducting the current to be switched by the semiconductor element of the chip. Contrary to this, a gate electrode may have a smaller area than a power electrode.

The first power electrode may be a collector electrode and the second power electrode may be an emitter electrode. In this case, the conductor plate may be a part of the emitter conductor.

The semiconductor switch chip may be bonded to a conducting area of the substrate metallization layer and to the conductor plate. Herein, bonding may refer to soldering, sintering, welding and/or gluing with an electrical conducting material.

The conductor plate may be any substantially flat electrically conducting body adapted for conducting a current through the semiconductor switch chip. For example, the conductor plate may be made of a metal plate, metal sheet or metallization layer of a printed circuit board. A printed circuit board may comprise a plastics substrate, which comprises one or more metallization layers on one or both sides.

The gate conductor only has to be adapted for conducting control signals to the semiconductor switch chip. For example, the gate conductor may comprise one or more bond wires and/or a metallization layer of a printed circuit board.

According to an embodiment of the invention, the conductor plate extends to a second conducting area of the substrate metallization layer and the gate conductor runs through an opening in the conductor plate arranged above the gate electrode. In this context, the term extend may mean that the conductor plate protrudes above a side of the semiconductor switch chip and/or that the conductor plate runs towards the second conducting area on the substrate.

In such a way, the conductor plate may cover the semiconductor switch completely, except of the gate electrode. Furthermore, there is more flexibility of orienting the conductor plate. For example, the end of the gate conductor bonded to the substrate metallization layer may be positioned in the same direction in which the gate conductor is oriented.

Additionally, the gate conductor and the conductor plate may be stacked, which minimize the footprint of the electrical conductors inside the power electronics module. Thus, as a further benefit, the power density of the power electronics module can be increased.

As a third benefit, parallel oriented gate conductor and conductor plate may reduce the stray inductance of the gate loop, i.e. the part of the circuitry of the power electronics module interconnecting the gate with usually the emitter of the semiconductor switch chip. Beside a low stray inductance of the commutation loop and the gate loop, also the coupling between these loops is reduced, which may result in faster and cleaner switching.

According to an embodiment of the invention, the opening in the conductor plate is a through-hole. For example, the opening may be centred with respect to the conductor plate and/or may be placed in the middle of the conductor plate with respect to an orientation of the conductor plate towards the end, which is bonded to the substrate metallization layer.

However, it also may be that the opening is positioned at a border of the conductor plate and/or may be a recess in the border of the conductor plate.

According to an embodiment of the invention, the gate conductor extends over the conductor plate. The gate conductor and the conductor plate may be oriented in the same direction. This may result in a substantially coaxial gate-emitter circuit arrangement. It also may be that the gate conductor and the conductor plate run substantially parallel with respect to each other, at least sectionally.

According to an embodiment of the invention, the gate conductor comprises a bond wire. The bond wire may be bonded to the gate electrode, may run through the opening in the conductor plate, may run along the conductor plate and/or above the conductor plate. At its other end, the bond wire may be bonded to a further conductor, which, for example, may be provided by a substrate and/or printed circuit board attached to a top of the conductor plate.

It has to be noted that the terms top and bottom used herein only may refer to an orientation of faces with respect to the substrate of the power electronics module. A top surface may face away from the substrate and a bottom surface may face towards the substrate. For example, the first power electrode may be a bottom electrode, while the second electrode and the gate electrode may be top electrodes.

According to an embodiment of the invention, the conductor plate is a metal clip. The conductor plate may be made of a metal sheet or metal plate and may be folded such that its ends, which may be bonded to the second power electrode and the substrate metallization layers, are at the demanded levels. The metal clip also may be folded that a middle part, which may have the opening, is on a higher level than the ends of the metal clip. In general, the metal clip may be a folded metal clip.

According to an embodiment of the invention, the metal clip is bonded with a first end to the second power electrode and the metal clip is bonded with a second end to a second conducting area of the substrate metallization layer. Analogously to the first conducting area of the substrate metallization layer, the second conducting area may be connected to a respective terminal of the power electronics module.

According to an embodiment of the invention, a gate conductor substrate is attached onto the second end of the metal clip, which gate conductor substrate has a gate metallization layer to which the bond wire is bonded. The gate conductor substrate may be a printed circuit board or a direct bonded copper substrate. Guiding and/or stacking the electric path of the gate above the conductor plate may additionally reduce the footprint of the electrical conductors of the power electronics module. The gate conductor substrate may be realized as a stripline above one or more conductor plates of one or more semiconductor switch chips of the power electronics module.

In addition, also the gate path after the gate conductor may have a low inductance. In summary, when the gate conductor is guided through an opening of the conductor plate and is bonded to a gate conductor substrate realized as a stripline, this may provide an excellent coaxial arrangement for minimized stray inductances and cross talk.

According to an embodiment of the invention, a bonding preform is bonded onto a first end of the metal clip, wherein a second semiconductor chip is bonded with a first power electrode onto the bonding preform. The second semiconductor chip may be a diode and/or may be based on SiC substrate, i.e. the second semiconductor chip may be a SiC diode. The diode may be connected anti-parallel to the switch of the semiconductor switch chip.

This may result in a stacked semiconductor chip arrangement reducing the footprint of the semiconductor chips of the power electronics module. Furthermore, the bonding preform may be used as a bond spacer, i.e. may have a height that the first semiconductor chip and the second semiconductor chip are spaced as far apart such than voltage clearing and clearance demands are fulfilled.

Furthermore, with the bonding preform, the bonding of the semiconductor chip stack may be simplified. A double-side bonding preform may allow for a pick and place process to manufacture the stack in an automation-friendly manner A pre-applied sinter paste on the metal clip may further improve manufacturability. Additionally, there may be no thermal extension mismatch of bond layers and an additional spacer.

According to an embodiment of the invention, the bonding preform is a sintering preform with a core of a metal material and two outer layers of sintering material, adapted for sintering the metal clip and the second semiconductor chip to the bonding preform. The sintering material may be a porous material made of Ag, for example made of nano particles, i.e. particles with a diameter of less than 1000 nm. The core may be made of an Ag plate or a plate of another metal material.

Sintering on the topside of the semiconductor switch chip may have the advantage to avoid any electrically conductive bond materials in the liquid phase near the sensitive edge termination areas that may lead to yield losses, for example due to solder balls and/or splashing during processing.

According to an embodiment of the invention, the bonding preform may be a transient liquid phase bonding preform. Such a preform may be made of particles and/or elements of two different metal materials, which are adapted for forming an alloy with a melting point inbetween the two metal materials. For example, such a preform may be made of a Cu mesh filled with Sn or Sn solder that transforms into intermetallic Cu/Sn phases upon heating.

According to an embodiment of the invention, a second metal clip is bonded to a second power electrode of the second semiconductor chip opposite to the first power electrode. The second metal clip may be bonded to the first conducting area of the substrate metallization layer. Such a clip also may cover substantially all of the second power electrode and/or the second semiconductor chip. It has to be noted that the second metal clip may be oriented in a different direction as the first metal clip which is bonded between the first and second semiconductor chip. In other words, the ends of the metal clips, which protrude from the stack of semiconductor chips may protrude in differently oriented directions, such as substantially orthogonal directions.

According to an embodiment of the invention, an electronics component is attached to a second metal clip above the second semiconductor chip. The space above the second semiconductor chip may be used for positioning additional components of the power electronics module. The component may comprise electronic components, passive elements and/or terminals. When further components of the power electronics module are placed on top of the second semiconductor chip, the overall substrate footprint may be reduced.

Passive elements may include temperature sensors, gate resistors, de-coupling capacitors, other sensors and/or filters.

The components may provide an online diagnostics of the power electronics module, for example by a temperature sensor, which may be thermally well coupled to the stack of semiconductor chips. Furthermore, the components may include an accelerometer, a vibration sensor, etc.

Terminals on the second semiconductor chip may be designed for providing power and/or auxiliary connections towards an outside of the power electronics module. Such a terminal may be arranged vertically and may protrude from the power electronics module in the same direction. This may further minimize the footprint of the conductors of the power electronics module.

According to an embodiment of the invention, a top substrate with a metallization layer is attached to the second metal clip above the second semiconductor chip. For example, the top substrate may be a circuit board, such as polymeric and/or ceramic circuit boards such as DBCs (direct bonded Cu), DBAs (direct bonded Al), AMBs (active metal brazed) and LTCCs (low-temperature co-fired ceramics) substrates.

According to an embodiment of the invention, a component is attached to the top substrate. For example, the top substrate may be a circuit board with electronics components. A combination of a circuit board and a discrete component may be beneficial, if the discrete component requires an electrically insulated attachment.

Furthermore, one or more bond wires may be bonded to the top substrate. For example, the top substrate may be used as intermediate conductor between two bond wire interconnections.

According to an embodiment of the invention, the power electronics module comprises: a printed circuit board attached on the semiconductor switch chip, wherein the conductor plate is an outer metallization layer of the printed circuit board.

The one or more semiconductor switch chips bonded to the substrate metallization layer may be stacked with a printed circuit board, in which one or more second semiconductor chips, for example providing a diode, are embedded. The second semiconductor chips may be pre-packaged by embedding in the printed circuit board and the printed circuit board may be bonded to the one or more second power electrodes of the one or more semiconductor switch chips.

According to an embodiment of the invention, an electrically conducting spacer is interconnected between a second conducting area of the substrate metallization layer and the conductor plate provided by the outer metallization layer of the printed circuit board. This spacer may have the same height as the semiconductor switch chip to compensate the distance between the bottom side of the printed circuit board and the substrate of the power electronics module.

According to an embodiment of the invention, the gate conductor comprises a metallization layer of the printed circuit board. It may be that inside and/or on surfaces of the printed circuit boards, several layers of conducting layers are present. For example, the gate conductor may be an intermediate metallization layer. In such a way, a part of the gate-emitter loop may be provided by parallel arranged conductors at low distance.

The gate electrode may be bonded to an area of a metallization layer provided by the printed circuit board. In this way, the gate connection and the emitter connection of the semiconductor switch chip may be manufactured in one step.

According to an embodiment of the invention, the printed circuit board comprises an opening above the opening in the conductor plate. The gate conductor may comprise a bond wire guided through both openings, i.e. the opening in the printed circuit board and the opening in the conductor plate bonded to the second power electrode of the semiconductor chip. In this case, the bond wire may be bonded to a metallization layer of the printed circuit board, for example, on a top side of the printed circuit board.

According to an embodiment of the invention, a second semiconductor chip is embedded into the printed circuit board and electrically interconnected with the conductor plate. As already mentioned, the printed circuit board may comprise one or more diode chips, which may be connected inside the printed circuit board to the metallization layer used as conductor plate.

According to an embodiment of the invention, the second semiconductor chip is interconnected via one or more metallization layers of the printed circuit board with the first conducting area of the substrate metallization layer. An electrically conducting spacer, which may have the same height as the semiconductor switch chip, may be interconnected between the first conducting area and the printed circuit board. In such a way, the electrical interconnections between the printed circuit board and the substrate with the semiconductor switch chip may be manufactured in one step.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
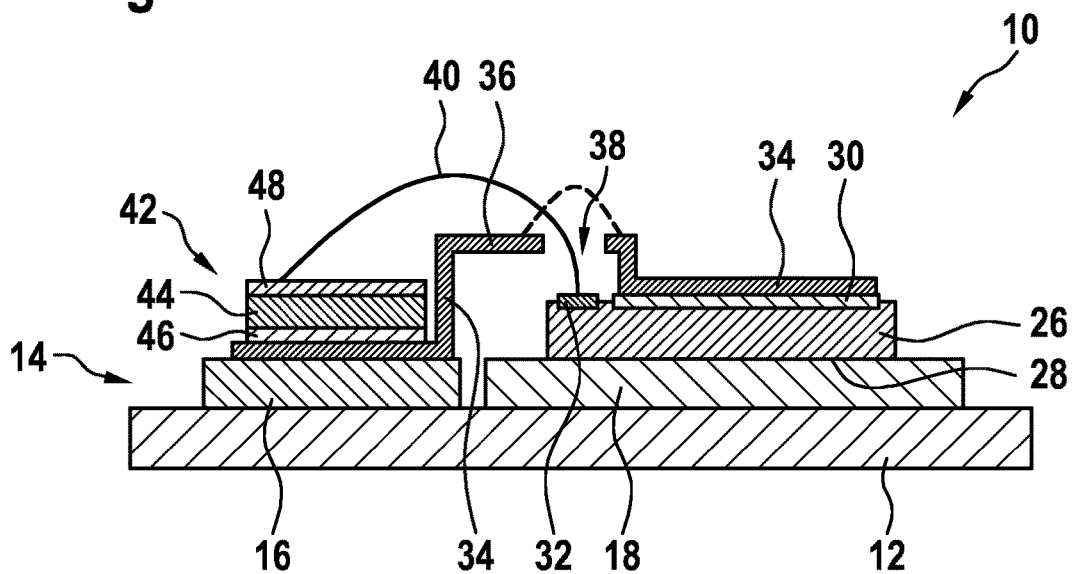
FIG. 1 schematically shows a cross-sectional view of a power electronics module according to an embodiment of the invention.

FIG. 1 shows a power electronics module 10, which comprises a substrate 12, for example a ceramics substrate, with a metallization layer 14 on a top side. The metallization layer 14, which may be a copper layer, may be intersected into several conducting areas 16, 18. The conducting area 16 may be connected with a DC− terminal 20 or AC terminal 22 of the power electronics module (see FIG. 7). The conducting area 18 may be connected with an AC terminal 22 or DC+ terminal 24.

On the conducting area 16, a semiconductor switch chip 26 is bonded with a first, bottom electrode 28. The semiconductor switch chip 26 may be based on SiC and/or may provide an IGBT or MOSFET. On the other, upper side, the semiconductor switch chip 28 comprises a second, upper power electrode 30 and besides the power electrode 30, a gate electrode 32. The semiconductor switch chip 26 may have a substantially planar body and/or the electrodes 28, 30 32 may be substantially planar metal layers.

Figure 7:
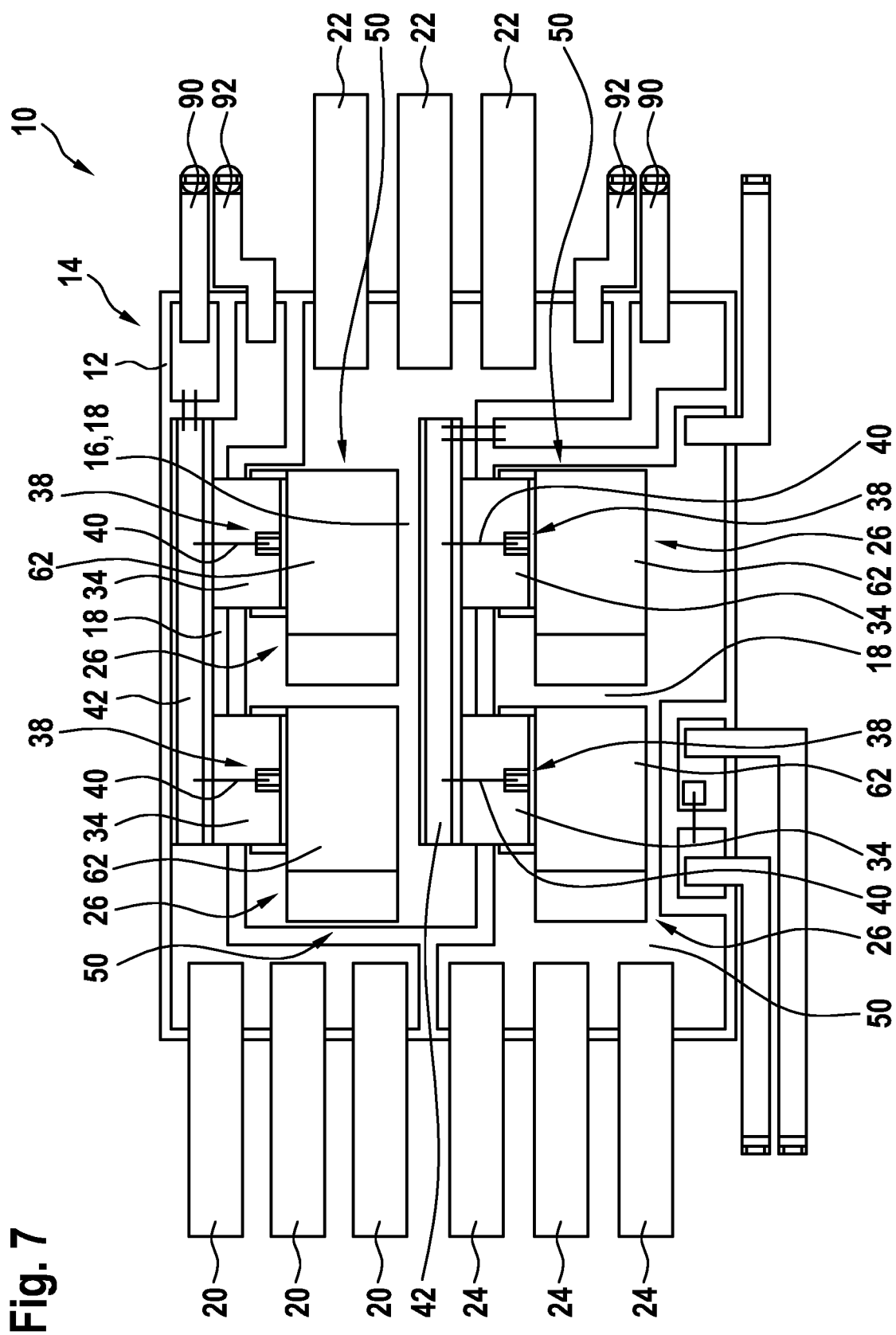
FIG. 7 schematically shows a top view of a power electronics module according to a further embodiment of the invention.

The power electrode 30 is bonded with a first end of a metal clip 34, which may be seen as a conductor plate 34, which is bonded with a second end to the conducting area 16. The metal clip may be made from a copper plate or sheet. The metal clip 34 is folded, such that its ends are on the level of the power electrode 30 and the conducting area 16 and such that a middle part 36 is elevated with respect to the power electrode 30. In the middle part 36, the metal clip 34 comprises an opening 38, which is situated above the gate electrode 30. Indicated by the dashed line, the parts of the metal clip 34 are interconnected with each other outside of the opening 38. As shown in FIG. 7, the opening 38 may be a through-hole, which may be centered in the metal clip 34.

Returning to FIG. 1, a gate conductor 40 in the form of a bond wire 40 is guided through the opening 38 and bonded with one end to the gate electrode 32. With the other end, the bond wire 40 is bonded to a gate conductor substrate 42, which may comprise an electrically isolating middle layer 44 and two outer electrically conducting layers 46, 48. With the layer 46, the gate conductor substrate 42 may be bonded onto an upper side of the end of the metal clip 34, which is bonded to the conducting area 16. The bond wire 40 is bonded to a gate conductor layer 48. The gate conductor substrate 42 may be a printed circuit board or a direct bonded copper ceramics substrate.

As shown in FIG. 7, the gate conductor substrate 42 may be designed like a stripline that is guided via several metal clips 34.

The bond wire 40 extends in the same direction as the metal clip 34. Due to the opening 38 in the metal clip 34, the bond wire 40 runs above the metal clip 34 and together with the gate conductor substrate 42 on the metal clip 34, the stray inductance of the gate-emitter loop is reduced.

Furthermore, the arrangement of the components of the power electronics module 10 is compact and the power density may be enhanced.

Figure 2:
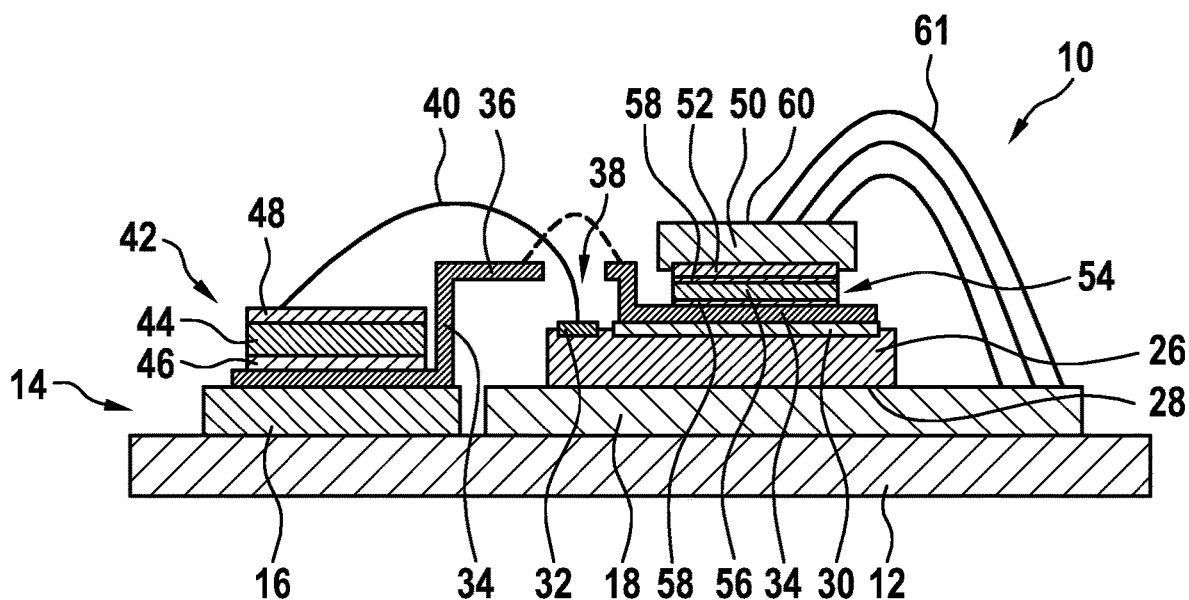
FIG. 2 schematically shows a cross-sectional view of a power electronics module according to a further embodiment of the invention.

FIG. 2 shows that a second semiconductor chip 50 may be stacked with the semiconductor chip 18. The semiconductor chip 50 is bonded with a bottom electrode 52 via a bonding preform 54 to an upper side of the end of the metal clip 34, which is bonded to the semiconductor chip 18.

The bonding preform 54 may be made of a metal core 56 to which two layers 58 of sinter material are attached. For example, the core 56 may be made of Ag or Cu and/or the sinter layers 58 may be made of Ag particles, such as nano Ag particles. The core 56 of the bonding preform 54 may be adjusted so that a sufficient gap distance is provided to insulate an edge termination of the second semiconductor chip 50. For example, the gap distance may be 150 μm to isolate 1.2 kV rated chips 26, 50.

An upper electrode 60 of the second semiconductor chip 50 may be connected with bond wires 61 with the first conducting area 18. The second semiconductor chip 50 may provide a diode, which is connected antiparallel to the switch of the first semiconductor chip 26 in this way.

Figure 3:
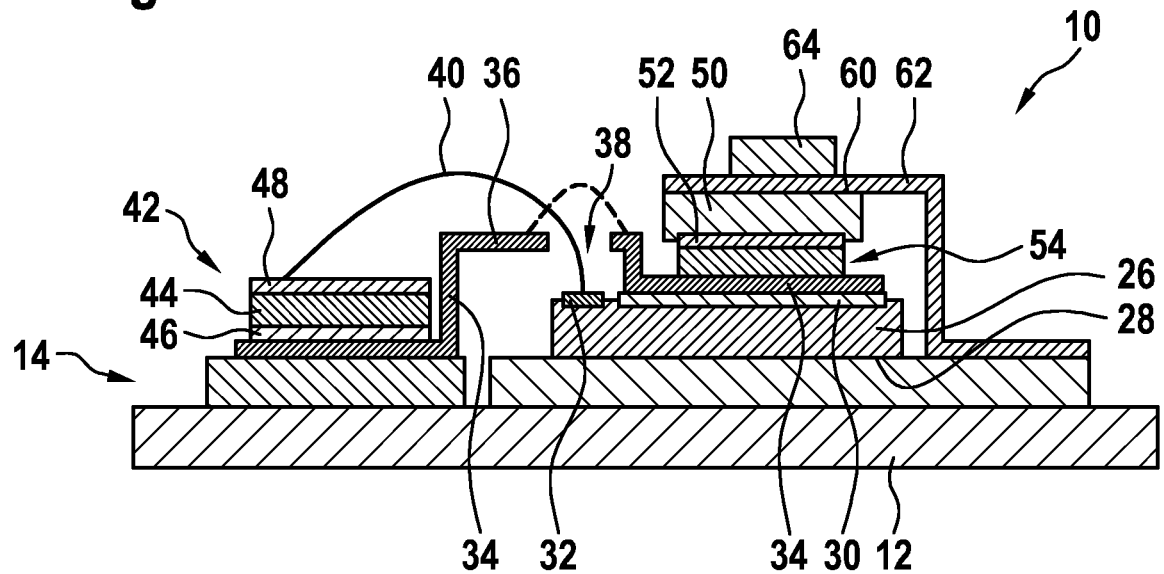
FIG. 3 schematically shows a cross-sectional view of a power electronics module according to a further embodiment of the invention.

FIG. 3 shows that alternatively the upper electrode 60 of the second semiconductor chip 50 may be connected with a further metal clip 62, which may be made of copper, with the first conducting area 18. Like the metal clip 34, the metal clip 62 may be folded to compensate the level difference between the electrode 60 and the conducting area 18.

As shown in FIG. 7, the second metal clip 62 may be oriented in a different direction as the metal clip 34. The end of the second metal clip 62, which is connected to the metallization layer 14, may extend in a different direction from the stack of semiconductor chips 26, 50 as the end of the first metal clip 34. In FIG. 7, the metal clips 34, 62 are oriented orthogonal with respect to each other.

Returning to FIG. 3, on top of the end of the metal clip 62, which is bonded to the upper electrode 60 of the semiconductor chip 50, a component 64 of the power electronics module 10 may be attached. Such a component 64 may be a terminal, which protrudes directly above the stack of semiconductor chips 26, 50 from the power electronics module 10. The component 64 also may be a temperature sensor or other sensor.

Figure 4:
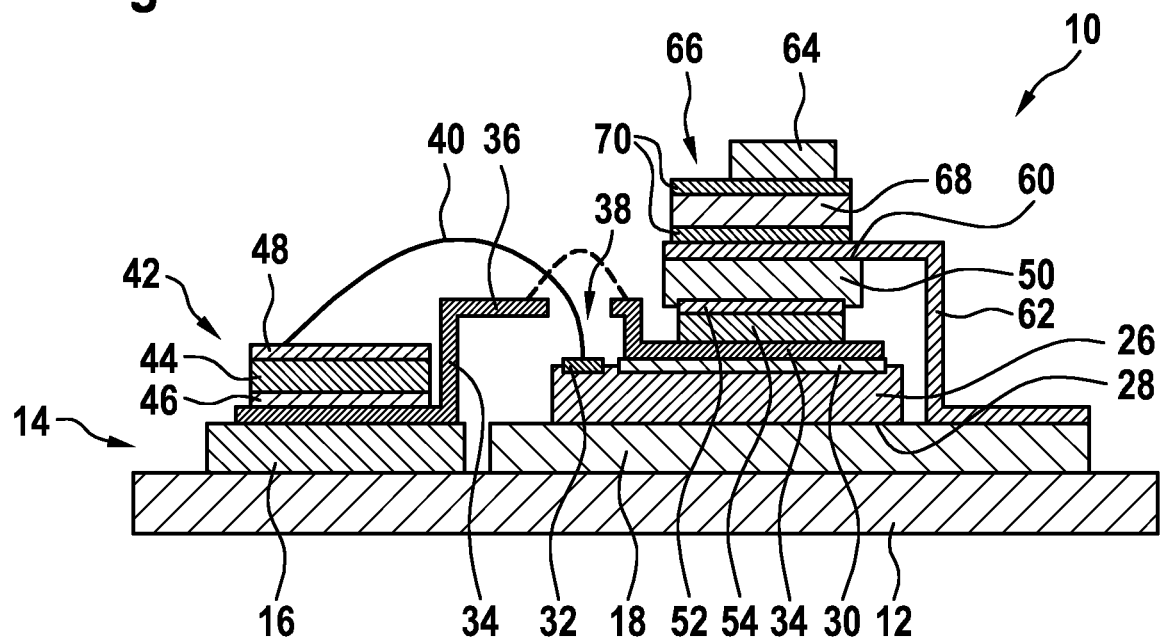
FIG. 4 schematically shows a cross-sectional view of a power electronics module according to a further embodiment of the invention.

As shown in FIG. 4, on top of the end of the metal clip 62, which is bonded to the upper electrode 60 of the semiconductor chip 50, a further substrate 66 may be bonded, which may carry such a component 64. The further substrate 66 may comprise an electrical isolating core 68 and two outer electrically conducting layers 70. For example, the further substrate may be a printed circuit board or a direct bonded copper substrate.

The manufacturing of the power electronics module 10 may be performed in the following way:

In a first step, the semiconductor switch chip 26 may be bonded to the substrate 12 and the metal clip 34 may be bonded to the semiconductor switch chip 26 and the conducting area 16.

In a second step, the second semiconductor chip 50 may be bonded to the metal clip 62. Alternatively, the bond wires 61 may be bonded after the next, third step.

In the third step, the sintering preform 54 is placed on the semiconductor switch chip 26 and the semiconductor chip 50 optionally together with the metal clip 62 is bonded to the semiconductor switch chip 26 via a sintering process.

All bonding processes between bonding interfaces of the power electronics module may be realized by Ag sintering. To allow for good manufacturability, the metal clips 34, 62 may have pre-applied sinter paste at the bonding interfaces.

Figure 5:
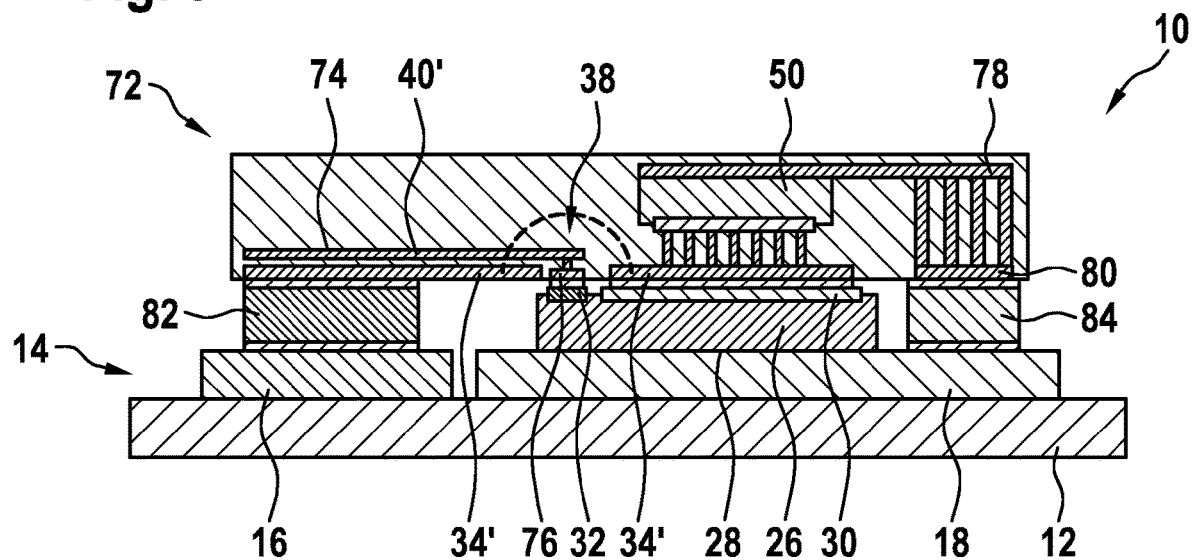
FIG. 5 schematically shows a cross-sectional view of a power electronics module according to a further embodiment of the invention.
Figure 6:
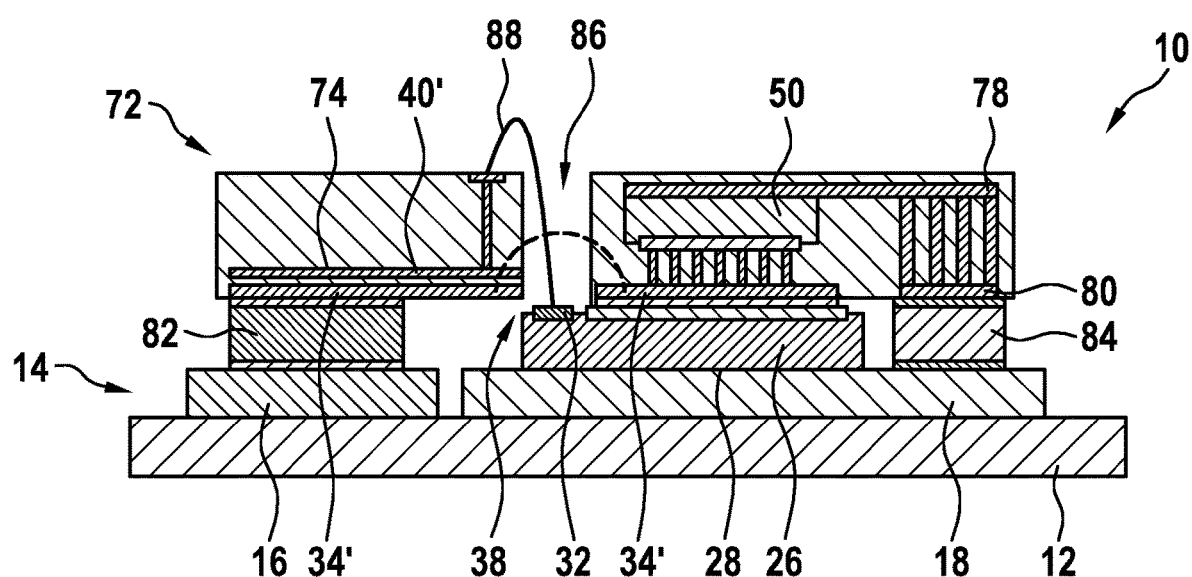
FIG. 6 schematically shows a cross-sectional view of a power electronics module according to a further embodiment of the invention.

FIGS. 5 and 6 show alternative embodiments, in which the second semiconductor chip 50 is embedded into a printed circuit board 72, which is attached on top of the first semiconductor chip 26.

The printed circuit board 72 has several metallization layers 34', 74, 76, 78, 80. The metallization layer 34', which is provided on the bottom side of the a plastics body of the printed circuit board 72, is bonded at one end to the upper power electrode 30 of semiconductor switch chip 26 and may be seen as conducting plate 34'. On the other end, the metallization layer 34' is bonded to an electrically conducting spacer 82, which may be made of a copper block and/or which is bonded to the conducting area 16.

The metallization layer 34' has an opening 38, in which the metallization layer 76 is arranged, which is also provided on the bottom side of the printed circuit board 72. The metallization layer 76 is interconnected with a via with the metallization layer 74, which together with the metallization layer 76 forms a gate conductor 40'. The metallization layer 76 is bonded to the gate electrode of the semiconductor chip 26.

The metallization layer 80 is also provided on the bottom side of the printed circuit board 72 and is bonded to a further electrically conducting spacer 84, which may be made of a copper block and/or which is bonded to the conducting area 18. The semiconductor switch chip 50 is interconnected via the metallization layer 78 and vias with the metallization layer 34' and the metallization layer 80.

FIG. 6 shows that also the plastics body of the printed circuit board 72 may have an opening 86 that is arranged above the opening 38. Through both openings 38, 86, a bond wire 88, which is bonded to the gate electrode 32, may be guided, which on its other end may be bonded to a top side of the printed circuit board. There, the bond wire 88 may be interconnected with the metallization layer 76, for example with a via. In this case, the gate conductor 40' also may comprise the bond wire 88.

FIG. 7 shows a power electronics module 10 with two pairs of stacks of two semiconductor chips 26, 50, which may be designed like shown in FIGS. 3 and 4. Each pair of stacks is connected in parallel and forms an arm of a half-bridge. The DC−terminals 20, the AC terminals 22 and the DC+terminals 24 provide interconnections to this half-bridge. Furthermore, the power electronics module 10 provides gate terminals 90 and auxiliary emitter terminals 92, which are arranged side by side for each pair of paralleled stacks.

The gate terminals 90 are connected via wire bonds with the gate conductor substrates 42 and the gate signals are conducted via the striplines provided by the gate conductor substrates 42 above the conducting areas 16 and the ends of the metal clips 34 after that the gate signals are conducted by the wire bonds 40, which run above the metal clips 34 and into the openings 38. This results in a low inductance, low coupling and a low footprint.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A power electronics module, comprising:
   a substrate with a substrate metallization layer, which is separated into conducting areas for providing conducting paths for the power electronics module;
   a semiconductor switch chip bonded with a first power electrode to a first conducting area of the substrate metallization layer;
   a conductor plate bonded to a second power electrode of the semiconductor switch chip opposite to the first power electrode;
   a gate conductor bonded to a gate electrode of the semiconductor switch chip besides the second power electrode;
   wherein the conductor plate extends to a second conducting area of the substrate metallization layer and the gate conductor runs through an opening in the conductor plate arranged above the gate electrode;
   wherein the gate conductor comprises a bond wire;
   wherein the conductor plate is a metal clip;
   wherein a bonding preform is bonded onto the metal clip; and
   wherein a second semiconductor chip is bonded with a first power electrode onto the bonding preform.

2. The power electronics module of claim 1, wherein the opening in the conductor plate is a through-hole.

3. The power electronics module of claim 2, wherein the gate conductor extends over the conductor plate.

4. The power electronics module of claim 2, wherein the metal clip is bonded with a first end to the second power electrode and the metal clip is bonded with a second end to the second conducting area of the substrate metallization layer; and
   wherein a gate conductor substrate is attached onto the second end of the metal clip, which gate conductor substrate has a gate metallization layer to which the bond wire is bonded.

5. The power electronics module of claim 1, wherein the gate conductor extends over the conductor plate.

6. The power electronics module of claim 2, wherein the bonding preform is a sintering preform with a core of a metal material and two outer layers of sintering material, adapted for sintering the metal clip and the second semiconductor chip to the bonding preform.

7. The power electronics module of claim 2, wherein a second metal clip is bonded to a second power electrode of the second semiconductor chip opposite to the first power electrode; and
   wherein the second metal clip is bonded to the first conducting area of the substrate metallization layer.

8. The power electronics module of claim 5, wherein the metal clip is bonded with a first end to the second power electrode and the metal clip is bonded with a second end to the second conducting area of the substrate metallization layer; and
   wherein a gate conductor substrate is attached onto the second end of the metal clip, which gate conductor substrate has a gate metallization layer to which the bond wire is bonded.

9. The power electronics module of claim 5, wherein the bonding preform is a sintering preform with a core of a metal material and two outer layers of sintering material, adapted for sintering the metal clip and the second semiconductor chip to the bonding preform.

10. The power electronics module of claim 5, wherein a second metal clip is bonded to a second power electrode of the second semiconductor chip opposite to the first power electrode; and
   wherein the second metal clip is bonded to the first conducting area of the substrate metallization layer.

11. The power electronics module of claim 1, wherein the metal clip is bonded with a first end to the second power electrode and the metal clip is bonded with a second end to the second conducting area of the substrate metallization layer; and
   wherein a gate conductor substrate is attached onto the second end of the metal clip, which gate conductor substrate has a gate metallization layer to which the bond wire is bonded.

12. The power electronics module of claim 11, wherein the bonding preform is a sintering preform with a core of a metal material and two outer layers of sintering material, adapted for sintering the metal clip and the second semiconductor chip to the bonding preform.

13. The power electronics module of claim 11, wherein a second metal clip is bonded to a second power electrode of the second semiconductor chip opposite to the first power electrode; and
   wherein the second metal clip is bonded to the first conducting area of the substrate metallization layer.

14. The power electronics module of claim 1, wherein the bonding preform is a sintering preform with a core of a metal material and two outer layers of sintering material, adapted for sintering the metal clip and the second semiconductor chip to the bonding preform.

15. The power electronics module of claim 14, wherein a second metal clip is bonded to a second power electrode of the second semiconductor chip opposite to the first power electrode; and
   wherein the second metal clip is bonded to the first conducting area of the substrate metallization layer.

16. The power electronics module of claim 1, wherein a second metal clip is bonded to a second power electrode of the second semiconductor chip opposite to the first power electrode; and
   wherein the second metal clip is bonded to the first conducting area of the substrate metallization layer.

17. The power electronics module of claim 16, wherein a top substrate with a metallization layer is attached to the second metal clip above the second semiconductor chip; and
   wherein at least one of an electric component and electronics component is attached to at least one of the second metal clip and the top substrate.

* * * * *